United States Patent [19]

Kasha

[11] Patent Number: 4,864,245
[45] Date of Patent: Sep. 5, 1989

[54] MODIFICATION UNIT FOR AN AMPLIFIER

[75] Inventor: John Kasha, Moorpark, Calif.

[73] Assignee: Kasha Amplifiers, Northridge, Calif.

[21] Appl. No.: 274,588

[22] Filed: Nov. 22, 1988

[51] Int. Cl.$^4$ .......................... H03F 3/68; G01H 1/02
[52] U.S. Cl. ..................................... 330/65; 330/145; 84/690; 84/695
[58] Field of Search ...................... 84/1.09, 1.14, 1.15, 84/1.16, 1.19, 1.24; 330/42, 65, 149, 150, 144, 145, 133

[56] References Cited

U.S. PATENT DOCUMENTS 3,213,181  10/1980  Snoddy et al. .................. 84/1.19
4,211,893   7/1980  Smith ............................. 330/149 X
4,214,214   7/1980  Merriman ....................... 330/65

Primary Examiner—Steven Mottola
Attorney, Agent, or Firm—Nilsson, Robbins, Dalgarn, Berliner, Carson & Wurst

[57] ABSTRACT

A modification unit for a musical instrument amplifier includes a modification circuit and a connector for connecting the modification circuit to a tube socket in place of one of the tubes in the pre-amp stage of the amplifier. The pre-amp includes at least a gain stage with a gain tube and a socket for receiving the gain tube where the tube socket has at least one plate contact, at least one cathode contact and at least one filament (heater) contact. The modification circuit includes a jack for receiving an electronic signal originated by the musical instrument and a circuitry for modifying the received electronic signal to generate a modified signal. The connector for connecting the modification circuit includes a first lead interconnected to one filament contact for providing ac power to the modification circuit, second lead interconnected to one of the plate contacts for outputting the modified signal to the amplifier and providing dc power to the plates of the various tubes in the modification circuit and a third lead for interconnecting the cathode contact to ground.

18 Claims, 2 Drawing Sheets

MODIFICATION UNIT FOR AN AMPLIFIER

BACKGROUND OF THE INVENTION

The present invention relates to musical instrument amplifier circuits and in particular to a modification for the pre-amp stage of a musical instrument amplifier which is incorporated by coupling the circuit to the socket of one of the amplifier tubes in place of the amplifier tube previously inserted in that socket.

Amplification of electronic signals generated by musical instruments at rock concerts and the like involve not merely amplification but also selected distortion of the signals to create various types of sound effects when the signal is applied to loud speakers. Because of the wide range of special effects and sound distortion characteristics which have been deemed desirable in rock concerts and the like, transistorized sound amplifiers are less desirable than tube type amplifiers because the desired distortion caused by tube amplification does not occur. Accordingly, the standard amplifiers used by instrumentalists such as rock artists in live performances is a tube amplifier such as a Marshals Master Volume Series Amplifier or other similar type of tube amplifier.

To illustrate, distortion can be caused by increasing the gain to drive the signal originating with the musical instrument to operate a greater percentage of the time in the fully saturated tube operating zone. This will result in clipping the signal which in turn causes significant distortion of the signal. Such distortion will cause the signal to exhibit considerably longer "sustain" characteristics than if the distortion was not present.

While conventional tube amplifiers are adequate to achieve many desired effects, musicians have exhibited considerable interest in sound effects which could be created by modifying the signal characteristics by modifying the electrical characteristics of the amplifier. Heretofore, such modifications have required dismantling of the amplifier and alteration of the amplifier's electrical circuitry at considerable expense. Even then, such changes are permanent requiring an artist to go to the expense and trouble of having different amplifiers for the different effects which might be desired in a musical concert.

The present invention solves this problem by providing a separate modification unit which may be coupled to the conventional tube amplifier by simply unplugging one of the tubes in the pre-amplifier stage and plugging a separate modification unit into that socket via a suitable cable to receive dc and ac power from the amplifier and provide a modified electronic signal back to the amplifier where it is amplified in the power amplifier stage and supplied to suitable speakers.

The modification unit could be of any type and could be designed in any desired way to modify the signal from the electrical instrument. In an illustrative embodiment, a modification unit is interconnected to replace the gain amplifier of the pre-amp stage of a Marshals Master Volume Series amplifier. The particular modification provides for a significant increase in gain in the signal which results in distortion of the signal by operating the circuit substantially in saturation thereby causing signal clipping and hence distortion. The result is the ability to greatly increase the sustain characteristics of the signal.

The present invention also enable easy incorporation of conventional effects circuits such as the Rocktron Hush Unit circuit to provide noise reduction. Such circuits may be easily plugged into the an effects plug in the modification unit to provide the desired effect.

SUMMARY OF THE INVENTION

A modification unit for a musical instrument amplifier includes a modification circuit and means for connecting the modification circuit to the socket in place of one of the tubes in a pre-amp stage of the amplifier. The pre-amp includes at least a gain stage with a gain tube and a socket for receiving the gain tube wherein the socket has at least one plate coupling, at least one cathode couple and at least one filament (heater) coupling. The modification circuit includes means for receiving an electronic signal originated by the musical instrument and means for modifying the received electronic signal to generate a modified signal. The means for connecting the modification circuit includes a first means interconnected to one filament coupling for providing ac power to the modification circuit, second means interconnected to one of the plate couplings for outputting the modified signal to the amplifier and providing dc power to the plates of the various tubes in the modification circuit and a third means for interconnecting the cathode coupling to ground.

In one embodiment, the modification circuit includes a signal input jack for receiving an electronic signal originated by a musical instrument, a first gain circuit, a first resistor network, a second gain circuit, a second resistor network, and a third gain circuit. The first gain circuit stage includes a first tube with a first plate, a first grid and a first cathode. The cathode is coupled to ground and the first grid is coupled to receive the electronics signal from the signal input jack so that the first gain stage generates a first amplified signal at the first plate. The first resistor network includes a potentiometer coupled between the first plate and ground and has a first wiper where the first wiper is coupled for manually altering the first amplified signal from the first plate to generate a first altered signal on the first wiper. The second gain circuit stage includes a second tube with a second plate, a second grid and a second cathode, where the second grid is coupled to the first wiper to receive the first altered signal whereby the second gain circuit stage generates a second amplified signal at the second plate. A second resistor network includes a second control potentiometer which is coupled between the second plate and ground where the second gain control amplifier has a second wiper. The second wiper is coupled for manually altering the second amplified signal to generate a second wiper signal. The third gain circuit stage includes a third tube with a third cathode, a third plate and a third grid where the third grid is coupled to the second wiper for generating output signal on the third plate. The third cathode is then coupled to ground and the third plate is coupled to the amplifier plate coupling to output the output signal to the amplifier.

In one embodiment of the invention, the modification apparatus includes an interface circuit which includes an interface switch coupled for selectively enabling interconnection of the second wiper signal to the effects interface circuit and an impedance matching circuit. The impedance matching circuit is coupled to the interface switch for receiving the second wiper signal when the interface signal enables interconnection of the second wiper signal to generate an impedance match signal. The interface circuit further includes a send connector coupled to the output of the impedance matched signal and a return connector coupled to the third grid. An effects circuit is then selectively coupled between the send connector and the return connector to enable alteration of the impedance match signal in a predefined manner to generate an effects signal which effects signal is coupled to the return connector through the third grid.

BRIEF DESCRIPTION OF THE DRAWINGS

A complete understanding of the present invention and of the above and other advantages thereof may be gained from a consideration of the following description of the preferred embodiments taken in conjunction with the accompanying drawings in which.

DETAILED DESCRIPTION

Figure 1:
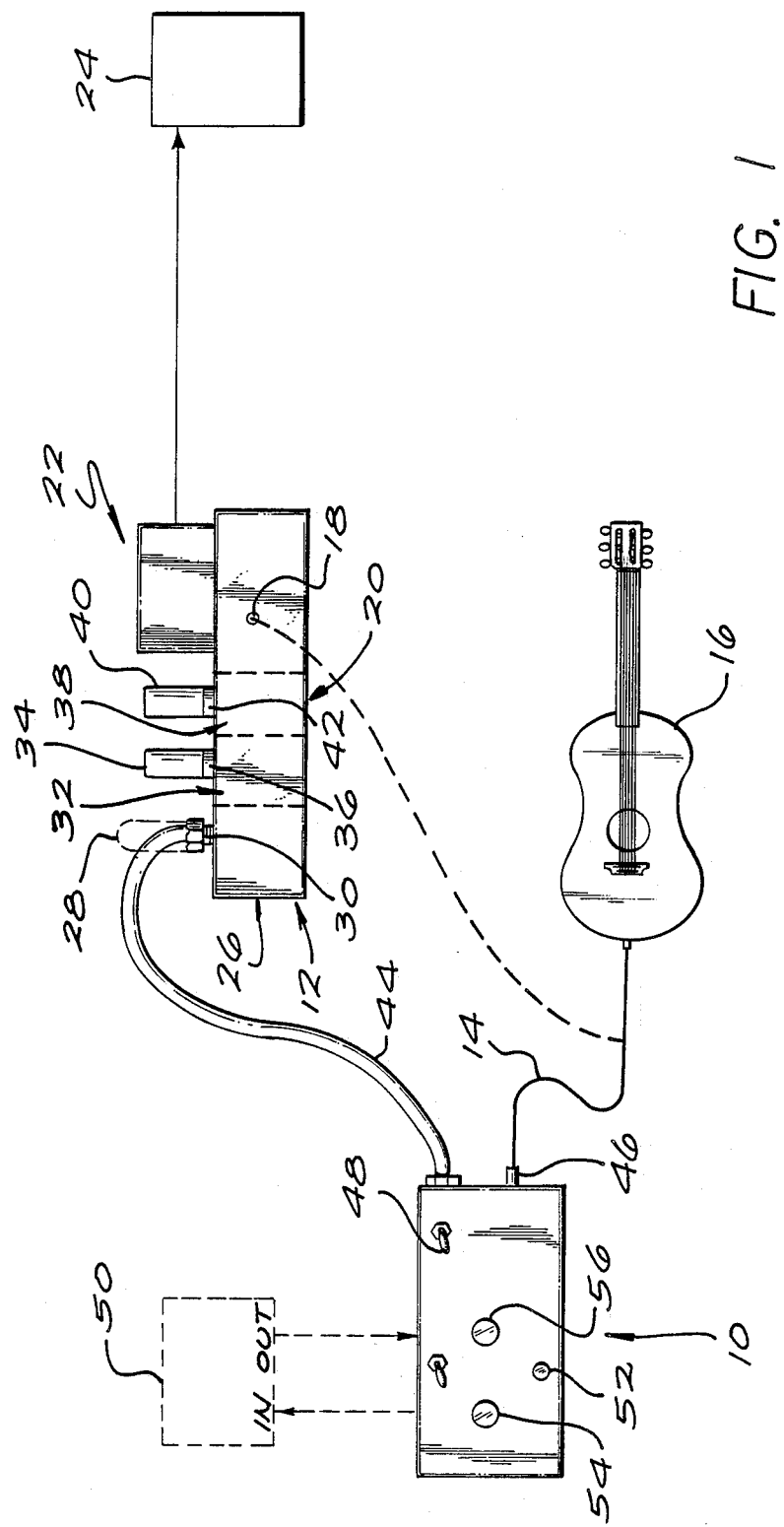
FIG. 1 is a block diagram illustrating the interconnection of the present invention to a conventional musical instrument amplifier.

Referring to FIG. 1, the present invention comprises a modification unit 10 coupled to a conventional amplifier 12 such as a Marshals Master Volume Series Amplifier. In general, a musician would insert a signal cable 14 from an electronic musical instrument such as a guitar 16 into an insert jack 18 of the amplifier 12. The signal received along the signal cable 14 would then be received by a pre-amp stage 20 after which it would pass to a power amplifier stage 22. The resultant amplified signal would then be sent to a speaker such as speaker 24 to generate the audible sound.

Typically, the pre-amp stage 20 of the amplifier 12 would include a first gain stage 26 with a gain tube 28 inserted in a first socket 30. The output from the gain stage 26 would then be provided to an impedance matching stage 32 which includes an impedance matching tube 34 inserted in a second socket 36. The output from the impedance matching stage 32 would then be coupled to a phase inverting stage 38 having a phase inverting tube 40 inserted in a third socket 42. In accordance with the present invention and depending on the particular function desired to be performed, the modification unit 10 is configured to be inserted into a selected one of the sockets 30, 36 or 42 by removing the respective tubes 28, 34 and 40 and interconnecting a socket connect cable 44 to that selected socket. As will be described more fully hereafter, power, both dc and ac, and the signal are provided via the various socket inserts along the cable 44.

In accordance with one embodiment of the invention, specifically illustrated in FIG. 1, the socket connect cable 44 is interconnected into socket 30 in place of gain tube 28. The signal cable 14 from the musical instrument 16 is withdrawn from insert jack 18 of the amplifier 12 and is inserted in jack 46 of the modification unit 10. Because the plate (not shown) of the tube 28 may be connected to one of two different pins depending on the amplifier model, a pin switch 48 may be incorporated to couple dc power to the modification unit 10 and to output the signal generated by the modification unit to the amplifier 12.

Optionally, a separate effects circuit 50 may be coupled to the modification unit 10. One such effects circuit commercially available is known as the "Rocktron Hush Unit" which is a noise reduction circuit. Of course, any other suitable circuit to modify the signal outputted to the amplifier 12 may also be incorporated without departing from the present invention. The modification unit further includes a power indicator light 52 which is activated when the connect cable 44 is coupled to one of the sockets in the pre-amp stage 20 to indicate that ac power is being received and suitably interconnected in the modification unit 10.

Finally a first gain potentiometer 54 and a second gain potentiometer 56 are included to enable signal gain adjustment which will result in alterations in the character of the signal being outputted to the amplifier 12 to effect the sound generated by the speaker 24.

Figure 2:
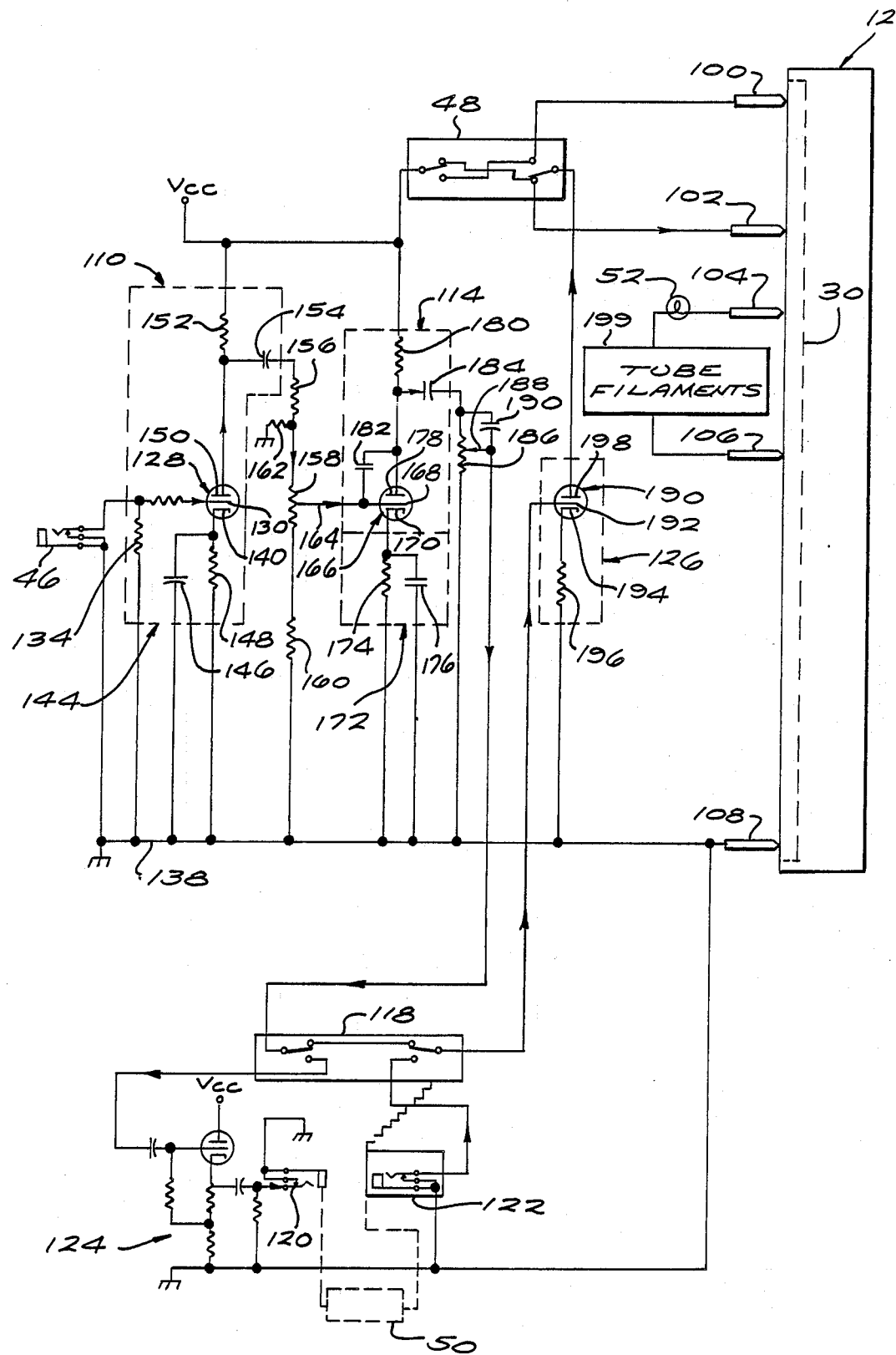
FIG. 2 is a circuit diagram illustrating one embodiment of the modification unit of the present invention.

Turning to FIG. 2, a specific modification unit circuit 10 which may be utilized upon interconnection to the first socket 30 of the amplifier 12 in place of the pre-amp stage gain tube 28 is illustrated. More specifically, the socket 30 includes a first plate connect contact 100, a second plate connect contact 102, a first filament (tube heater) contact 104, a second filament contact 106 and a cathode (ground) contact 108. In general, the contacts 100, 102, 104, 106 and 108 will be inserts in the socket 30 and pins on the end of the socket connect cable 44 with the pins arranged to mate with the inserts in the socket 30. Further, only one of the first and second plate connect contacts 100 and 102 will generally be active. However, to provide interconnect versatility, the pin switch 48 is interconnected between the first and second plate connect contacts 100 and 102 to enable either one or the other to be selectively coupled to the modification circuit. For illustration purposes, in FIG. 2 the pin contact 102 is coupled to the plate of the tube 28 as the active contact of the particular amplifier configuration 12 illustrated. DC power is therefore provided through pin 102 to the plates of the tubes incorporated in the modification circuit illustrated in FIG. 2. The output signal is likewise provided on the second plate contact 102 for inputting to the amplifier 12 and outputted to the speaker 24 (FIG. 1).

The modification circuit 10 further includes a first gain stage 110 which is coupled to receive a signal through the input jack 46 from the musical instrument 16. The output from the first gain stage is provided to a first resistor network 112 with the output signal from the first resistor network 112 coupled to a second gain stage 114. The output of the second gain stage is coupled to a second resistor network 116, whose output is coupled to a switch jack 118. The switch jack 118 is preferably configured so that if an effects circuit 50 is coupled between a send connector 120 and a return connector 122, then the switch 118 is activated to couple the signal from the second resistor network through an impedance matching stage 124 and the effects circuit 50. If an effects circuit 50 is not coupled across the send connector 120 and the return connector 122, then the switch 118 is positioned to bypass the impedance matching stage 124 and instead couple the output of the second resistor network directly to a third gain stage 126. If the effects circuit 50 is inserted, then the signal received by the third gain stage 126 will be the output of the effects circuit 50, rather than the direct output of the second resistor network 116.

Finally, the output of the third gan stage 126 is coupled to the second plate contact 102 in accordance with the illustration of FIG. 2.

The first gain stage 110 may typically be configured as illustrated in FIG. 2 to include a first tube 128 having a grid 130 coupled through resistor 132 to the signal input jack 46. Hence, the signal received through the input jack 46 is applied to the grid 130. A second resistor 134 is coupled between the signal lead 136 of the input jack 46 and the ground lead 138 of the signal jack 46. The first tube 128 further includes a cathode 140 which is coupled to the ground lead 138 through a first bias network 144. Typically, a suitable biar network includes a capacitor 146 and a resistor 148 coupled in parallel between the cathode 140 and the ground lead 138. The first tube 128 further includes a plate 150 which is coupled through a fourth resistor 152 and switch 48 to one of the plate connect contacts such as plate connect contact 102. The first gain stage 110 finally includes a capacitor 154 coupled between the fourth resistor 152 and the plate 150 of the first tube 128. Accordingly, while dc power is provided through resistor 152 to the plate of the first tube 128, the voltage signal is coupled to the first resistor network 112 through the capacitor 154.

The first resistor network 112 may be of any suitable configuration but, in accordance with the invention, comprises a sixth impedance matching resistor 156, a first gain potentiometer 158 and a seventh limiting resistor 160, all coupled in series between the capacitor 154 and the ground lead 138. A balancing resistor 162 is coupled between a point between resistor 156 and the first gain potentiometer 158 and the ground lead 138. The first gain potentiometer 158 includes a wiper 164 which is coupled to the second gain stage 144. Hence, the signal passes through the capacitor 154, the impedance matching resistor 156, the first gain potentiometer 158 and is outputted through the wiper 164 of the first gain potentiometer 158.

The second gain stage 114 includes a second tube 166 having a grid 168 which is coupled to the wiper 164 of the first gain potentiometer 158. The tube 166 further includes a cathode 170 which is coupled to the ground lead 138 through a second bias network 172 which comprises a resistor 174 and capacitor 176 coupled in parallel between the cathode 170 and ground 138. The tube 166 further includes a plate 178 which is coupled through a resistor 180 and switch 48 to the plate contact 102 to provide dc power to the plate 178.

In order to prevent squeal, a feedback capacitor 182 is coupled between the plate 178 and the grid 168 of the tube 166. Finally, a capacitor 184 is coupled between the resistor 180 and the plate 178 to output the signal to the second resistor network 116. The second resistor network 116 comprises a second gain potentiometer 186 which is coupled between the capacitor 184 and the ground lead 138. The second gain potentiometer 186 has a wiper 188 which is coupled to the switch 118. A suitable filter capacitor 190 is coupled between the wiper 188 and the location between the capacitor 184 and the second gain potentiometer 186. Hence, the signal passes through the capacitor 184 and the wiper 188 into the switch 118.

As previously indicated, if an effects circuit 50 is coupled between the send connector 120 and the return connector 122, the wiper signal will be coupled by the switch 118 to pass through the impedance matching stage 124 which is typically a conventional cathode follower circuit illustrated in FIG. 2 but will not be described in detail.

The signal coming from the switch 118 whether it is simply the output signal on the wiper 188 or a signal modified by the impedance matching circuit 124 and effects circuit 50, is coupled to the third gain stage 126. The third gain stage includes a tube 190 having a grid 192 which is coupled to receive the signal from the switch jack 118. The tube 190 further has a cathode 194 which is coupled through a bias resistor 196 to the ground lead 138. Finally, the tube 190 includes a plate 198 which is coupled to the second plate contact 102 to thereby output the signal to the amplifier 12.

In accordance with the invention, the ground lead 138 to which all of the grounds in the modification circuit illustrated in FIG. 2 are coupled is connected to the cathode contact 108 of the socket 30. Finally, ac power is provided to each of the tube heaters (filaments) by connecting the filament pins of each of the tubes (shown generally for all tubes as block 199) across the filament contacts 104 and 106. Preferably coupled in series between the contact 104 and the contact 106 is the indicator light 52 so that when the socket connect cable 44 is coupled to the socket 30, ac power ill be supplied between contact 104 and contact 106 causing power to pass through and hence light upon the indicator light 52.

In operation, the present invention enables a conventional amplifier 12 to be modified by simply replacing one of the preamplifier tubes with a modification unit. The modification unit can modify the signal in any manner desirable, but in accordance with the illustrated embodiment of the present invention, the modification is done by greatly increasing the amplification of the signal. This increased gain results in operating the circuit more often in the fully saturated range which results in chopping of the signal and hence more distortion. The highly distorted signal provides desirable effects, particularly in the generation of rock music. Hence, the present invention allows the sound characteristic generated by the a musical instrument and amplifier combination to be considerably modified with no requirement to alter the internal circuitry of the amplifier 12.

Of course, various other circuits other than the one illustrated in FIG. 2 can be incorporated and may be more desirable if the second or third tubes 34 and 40, illustrated in FIG. 1, are replaced instead of the gain stage tube 28. Accordingly, it will be appreciated that there are various modifications and alterations in the present invention which can be made without departing from the invention in its broadest aspects.

What is claimed is:

1. A modification unit for a musical instrument amplifier adapted for amplifying an electronic signal originated by a musical instrument, the amplifier having a preamplifier section comprising a gain stage having a gain tube and a first socket for receiving the gain tube, an impedance matching stage having an impedance matching tube and a second socket for receiving the impedance matching tube and a phase inverter stage having a phase inverting tube and a third socket for receiving the phase inverting tube, each socket having at least one plate contact, at least one cathode contact and at least one filament contact, the modification unit comprising:

a modification circuit comprising:
  means for receiving the electronic signal originated by the musical instrument, and
  means for modifying the received electronic signal to generate a modified signal; and
means for connecting the modification circuit to a selected one of the first, second and third sockets in place of a selected one of the gain, impedance matching or phase inverting tubes respectively, the means for connecting comprising:
first means interconnected to at least one filament contact for providing electrical power to the modification circuit;
second means interconnected to at least one of the plate contacts for outputting the modified signal to the amplifier; and
third means for interconnecting the cathode contact to ground.

2. The modification unit of claim 1 wherein the second means is further interconnected to at least one of the plate contacts for providing dc power to the modification circuit.

3. A modification unit for a musical instrument amplifier adapted for amplifying an electronic signal originated by an electronic instrument, the amplifier having a preamplifier stage comprising at least one socket with a tube therein, each socket having at least one plate contact and at least one cathode contact, the modification unit comprising:
a modification circuit comprising:
means for receiving the electronic signal originated by the electronic instrument, and
means for modifying the received electronic signal to generate a modified signal,
means for connecting the modification circuit to the socket in place of the tube inserted therein, the means for connecting comprising:
first means interconnected to at least one of the plate contacts for outputting the modified signal to the amplifier; and
second means interconnected to at least one of the cathode contacts for providing a ground connection for the modification circuit.

4. The modification unit of claim 3 wherein the first means is further interconnected to at least one of the plate contacts for providing dc power to the modification circuit.

5. A modification unit for a musical instrument amplifier adapted for amplifying an electronic signal originated by an instrument, the amplifier having a preamplifier comprising a gain stage having a gain tube and a socket for receiving the gain tube, the socket having at least one plate contact, at least one cathode contact and at least one filament contact, the modification unit comprising:
modification circuit comprising:
means for receiving the electronic signal originated by the musical instrument, the electronic signal being inputted directly to the means for receiving instead of being inputted to the amplifier, and
means for modifying the received electronic signal to generate a modified signal,
means for connecting the modification circuit to the socket in place of the gain tube, the means for connecting comprising:
first means interconnected to one filament contact;
second means interconnected to one of the plate contacts for outputting the modified signal to the amplifier; and
third means for interconnecting the cathode contact to ground.

6. The modification unit of claim 5 wherein the second means is further interconnected to at least one of the plate contacts for providing dc power to the modification circuit.

7. The modification unit of claim 5 wherein the means for modifying comprises a modification circuit comprising:
a signal input jack for receiving the electronic signal originated by the instrument;
a first gain circuit stage having a first tube with a first plate, a first grid and a first cathode, the cathode coupled to ground and the first grid coupled to receive the electronic signal from the signal input jack, the first gain circuit stage generating a first amplified signal at the first plate;
a first resistor network comprising a first potentiometer coupled between the first plate and ground and having a first wiper, the first wiper coupled for manually altering the first amplified signal from the first plate to generate a first altered signal on the first wiper;
a second gain circuit stage having a second tube with a second plate, a second grid and a second cathode, the second grid coupled to the first wiper to receive the first altered signal the second gain circuit stage generating a second amplified signal at the second plate;
a second resistor network comprising a second gain control potentiometer coupled between the second plate and ground and having a second wiper, the second wiper coupled for manually altering the second amplified signal to generate a second wiper signal; and
a third gain circuit stage having a third tube with a third plate, a third grid, and a third cathode, the third grid coupled to the second wiper for generating an output signal on the third plate, the third cathode coupled to ground and the third plate coupled to the amplifier plate coupling.

8. The modification unit of claim 7 wherein the modification circuit further comprises an effects interface circuit coupled between the second wiper and the third grid, for enabling an effects circuit to be interconnected to the modification circuit.

9. The modification unit of claim 8 wherein the effects interface circuit comprises:
an interface switch coupled for selectively enabling interconnection of the second wiper signal to the effects interface circuit;
an impedance matching circuit coupled to the interface switch for receiving the second wiper signal and generating an impedance matched signal;
a send connector coupled to output the impedance matched signal;
a return connector coupled to the third grid; and
an effects circuit coupled between the send connector and the return connector, the effects circuit changing the impedance matched signal in a predefined manner to generate an effects signal, the effects signal coupled through the return connector to the third grid.

10. The modification unit of claim 9 wherein the impedance matching circuit is a cathode follower circuit.

11. The modification unit of claim 7, wherein there are at least two plate contacts, the modification apparatus further comprising a pin switch coupled to the plate contacts for selectively coupling a selected single plate contact to the third plate.

12. The modification unit of claim 7 further comprising a feedback capacitor coupled between the second plate and the second grid.

13. The modification unit of claim 7 further comprising a first bias network coupled between the first cathode and ground and a second bias network coupled between the second cathode and ground, the first and second bias networks each comprising a capacitor and a resistor coupled in parallel.

14. The modification unit of claim 7 further comprising a filter coupled between the second wiper and the second plate.

15. The modification unit of claim 7 wherein the first gain potentiometer has a first terminal and a second terminal, the first resistor network further comprising:
an impedance matching resistor coupled between the first plate and the first terminal,
a balancing resistor coupled between the first terminal and ground, and
a current limiting resistor coupled between the second terminal and ground.

16. The modification unit of claim 9 wherein the interface switch is coupled to the return connector whereby interconnection of the effects circuit to the return connector causes the interface switch to couple the impedance matching circuit between the second wiper and the third grid.

17. The modification unit of claim 7 wherein the plate coupling is interconnected to each of the first, second and third plates to provide dc power thereto.

18. The modification unit of claim 7 wherein each of the tubes has a heater, the filament contacts coupled across the heaters of each tube for providing ac power to said heaters.

* * * * *